(12) United States Patent
Stachowiak, Jr.

(10) Patent No.: US 10,598,699 B2
(45) Date of Patent: Mar. 24, 2020

(54) SECURING APPARATUS AND METHOD

(75) Inventor: John Edward Stachowiak, Jr., Houston, TX (US)

(73) Assignee: DeWalch Technologies, Inc., Houston, TX (US)

( * ) Notice: Subject to any disclaimer, the term of this patent is extended or adjusted under 35 U.S.C. 154(b) by 0 days.

(21) Appl. No.: 12/225,996

(22) PCT Filed: Apr. 4, 2007

(86) PCT No.: PCT/US2007/008611
§ 371 (c)(1),
(2), (4) Date: May 21, 2009

(87) PCT Pub. No.: WO2007/114949
PCT Pub. Date: Oct. 11, 2007

(65) Prior Publication Data
US 2009/0264012 A1    Oct. 22, 2009

Related U.S. Application Data

(60) Provisional application No. 60/789,092, filed on Apr. 4, 2006.

(51) Int. Cl.
 *H01R 33/945* (2006.01)
 *G01R 11/24* (2006.01)
 (Continued)

(52) U.S. Cl.
 CPC .............. *G01R 11/24* (2013.01); *F16B 2/08* (2013.01); *H01R 13/6277* (2013.01)

(58) Field of Classification Search
 USPC ........ 439/508, 517; 361/659, 664, 665, 666, 361/667; 292/307 R, 320, 321
 See application file for complete search history.

(56) References Cited

U.S. PATENT DOCUMENTS

| | | | |
|---|---|---|---|
| 1,587,754 A | 6/1926 | Brune | |
| 3,429,605 A | 2/1969 | Soesbergen | |
| | (Continued) | | |

FOREIGN PATENT DOCUMENTS

| | | |
|---|---|---|
| CA | 2647734 | 10/2007 |
| WO | 2007114949 | 10/2007 |
| WO | WO2007114949 | 11/2007 |

OTHER PUBLICATIONS

U.S. Appl. No. 11/732,937, filed Apr. 4, 2007 (1 page).
(Continued)

*Primary Examiner* — Khiem M Nguyen
(74) *Attorney, Agent, or Firm* — DeWalch Technologies, Inc.

(57) ABSTRACT

When securing a watthour meter to a meter box base, a meter sealing ring is typically used. A quick-fastening watthour meter retaining member is provided, in certain embodiment of the present invention, to reduce installation time and generally comprises a circular band, a connector housing member, and a receiver housing member. The connector housing member and a receiver housing member are preferably mounted to the terminus ends of the circular band. A portion of the connector housing member, comprising locking protrusions or "teeth", is adapted to engage, with a ratchet-type action, in one example embodiment, and fasten into the receiver housing member, which contains, a pre-installed "padlock type" frangible sealing device in an example embodiment. Removal of the ring is accomplished by simply cutting, in one embodiment, and removing the frangible sealing device and allowing the housings to disengage from each other.

39 Claims, 11 Drawing Sheets

(51) Int. Cl.
  *F16B 2/08* (2006.01)
  *H01R 13/627* (2006.01)

(56) References Cited

U.S. PATENT DOCUMENTS

| | | | |
|---|---|---|---|
| 4,149,741 A * | 4/1979 | Lipscomb et al. | 292/256.6 |
| 4,221,409 A * | 9/1980 | Harley | 292/322 |
| 4,674,778 A | 6/1987 | Ruiz | |
| 5,048,881 A | 9/1991 | Renfro | |
| 5,120,097 A | 6/1992 | Fattori et al. | |
| 5,161,838 A | 11/1992 | Ely | |
| 5,333,747 A | 8/1994 | Wike | |
| 5,752,296 A | 5/1998 | Chaput | |
| 5,884,949 A | 3/1999 | Leon et al. | |
| 6,406,074 B1 | 3/2002 | Mahaney | |
| 6,416,091 B1 * | 7/2002 | Wenk et al. | 292/320 |
| 6,752,652 B1 * | 6/2004 | Robinson | 439/517 |
| 6,855,005 B2 * | 2/2005 | Acacio | 439/517 |
| 7,189,109 B2 * | 3/2007 | Robinson | 439/517 |
| 2005/0285413 A1 | 12/2005 | Davidson | |
| 2007/0249219 A1 | 10/2007 | Stachowiak | |
| 2009/0264012 A1 | 10/2009 | Stachowiak | |
| 2009/0309376 A1 | 12/2009 | Stachowiak | |
| 2011/0209327 A1 | 9/2011 | Stachowiak | |

OTHER PUBLICATIONS

U.S. Appl. No. 12/380,938, filed Mar. 4, 2009 (1 page).
U.S. Appl. No. 13/005,519, filed Jan. 12, 2011 (1 page).
U.S. Appl. No. 12/225,996, filed Oct. 3, 2008 (3 pages).
PCT International Search Report ISR and Written Opinion for International Application No. PCT/US07/08611 filed Apr. 4, 2007 (6 pages).
International Preliminary Report on Patentability for International Application No. PCT/US07/08611 filed Apr. 4, 2007 (4 pages).
Letter from Foreign Counsel dated May 16, 2012 regarding status checks and Request for Examination in connection with Canadian Patent Application No. 2,647,734 (2 pages).
Letter from Foreign Counsel dated May 16, 2012 regarding Request for Examination and voluntary submission of art, making no admission regarding relevancy, in connection with Canadian Patent Application No. 2,647,734 (3 pages).
E-mail from Applicant dated Aug. 16, 2012 regarding voluntary submission of art (making no admission regarding relevancy) in connection with Canadian Patent Application No. 2,647,734 (1 page).
E-mail from Applicant dated Mar. 28, 2013 in response to e-mail from Foreign Counsel dated Mar. 25, 2013 regarding payment of the maintenance fee in connection with Canadian Patent Application No. 2,647,734 (5 pages).
E-mail/Letter from Foreign Counsel dated Sep. 4, 2013 regarding CIPO Office Action dated Aug. 26, 2013 in connection with Canadian Patent Application No. 2,647,734 (5 pages).
E-mail from Applicant dated Feb. 25, 2014 in response to e-mail from Foreign Counsel dated Sep. 4, 2013 regarding response to CIPO Office Action dated Aug. 26, 2013 in connection with Canadian Patent Application No. 2,647,734 (9 pages).
E-mail from Foreign Counsel dated Feb. 26, 2014 in response to e-mail from Applicant dated Feb. 25, 2014 regarding response to CIPO Office Action dated Aug. 26, 2013 in connection with Canadian Patent Application No. 2,647,734 (2 pages).
E-mail/Letter from Foreign Counsel dated Jun. 10, 2014 regarding CIPO Office Action dated Jun. 2, 2014 in connection with Canadian Patent Application No. 2,647,734 (5 pages).
E-mail from Applicant dated Nov. 25, 2014 in response to e-mail from Foreign Counsel dated Jun. 10, 2014 regarding CIPO Office Action dated Jun. 2, 2014 in connection with Canadian Patent Application No. 2,647,734 (5 pages), (2 pages).
E-mail from Foreign Counsel dated Nov. 26, 2014 in response to e-mail from Applicant dated Nov. 25, 2014 regarding response to CIPO Office Action dated Jun. 2, 2014 in connection with Canadian Patent Application No. 2,647,734 (1 page).
U.S. Appl. No. 60/789,092, filed Apr. 4, 2006 (FW as of Oct. 20, 2015) (1 page).
U.S. Appl. No. 13/005,519, filed Jan. 12, 2011 (FW as of Oct. 20, 2015) (4 page).
E-mail/Letter from Foreign Counsel dated Oct. 5, 2015 regarding CIPO Office Action dated Dec. 2, 2014 in connection with Canadian Patent Application No. 2,647,734 (4 pages).
E-mail/Letter from Applicant dated Dec. 1, 2015 in response to e-mail from Foreign Counsel dated Nov. 25, 2015 regarding CIPO Office Action dated Dec. 2, 2014 in connection with Canadian Patent Application No. 2,647,734 (15 pages).
E-mail/Letter from Foreign Counsel dated Dec. 3, 2015 regarding CIPO Office Action dated Dec. 2, 2014 in connection with Canadian Patent Application No. 2,647,734 and Submitted Request for Reinstatement (14 pages).
E-mail/Letter from Foreign Counsel dated Dec. 11, 2015 regarding CIPO Office Action dated Dec. 2, 2014 in connection with Canadian Patent Application No. 2,647,734 and Notice of Reinstatement (3 pages).
U.S. Appl. No. 12/380,938, filed Mar. 3, 2009 (1 pages) for PCT International Application PCT/US2007/008611 filed Apr. 5, 2007 from WIPO (1 page).
U.S. Appl. No. 13/751,136, filed Jan. 27, 2013 (6 pages).*—(No admission is being made regarding applicability, relevancy, materiality or otherwise and as per IDS Statement Submitted herewith).
U.S. Appl. No. 14/763,800, filed Jul. 27, 2017 (3 pages).*—*(No admission is being made regarding applicability, relevancy, materiality or otherwise and as per IDS Statement Submitted herewith).
PCT International Application No. PCT/US13/23349 filed Jan. 27, 2013 (2 pages). *—*(No admission is being made regarding applicability, relevancy, materiality or otherwise and as per IDS Statement Submitted herewith).
PCT International Application No. PCT/US13/23349 filed Jan. 27, 2013—ISR and Written Opinion (12 pages).*—*(No admission is being made regarding applicability, relevancy, materiality or otherwise and as per IDS Statement Submitted herewith).
PCT International Application No. PCT/US13/23349 filed Jan. 27, 2013—Notification of Transmittal of International Preliminary Report on Patentability (5 pages).*—*(No admission is being made regarding applicability, relevancy, materiality or otherwise and as per IDS Statement Submitted herewith).
U.S. Appl. No. 60/789,092, filed Apr. 4, 2006 abandoned in lieu of related U.S. Appl. No. 11/732,937)) filed Apr. 4, 2007.
Non-final Rejection dated Nov. 16, 2007 in connection with related U.S. Appl. No. 11/732,937)) (4 pages).
Applicant Arguments/Reconsideration After Non-final Rejection dated May 16, 2008 in connection with related U.S. Appl. No. 11/732,937)) (7 pages).
Final Rejection dated Sep. 4, 2008 in connection with related U.S. Appl. No. 11/732,937)) (5 pages).
Abandonment dated Jun. 12, 2009 in connection with related U.S. Appl. No. 11/732,937)) in lieu of Continuation in Part filed May 21, 2009. (2 pages).
Non-final Rejection dated Sep. 30, 2009 in connection with related U.S. Appl. No. 12/380,938)) (5 pages).
Applicant Arguments/Reconsideration After Non-final Rejection dated Mar. 30, 2010 in connection with related U.S. Appl. No. 12/380,938)) (5 pages).
Final Rejection dated Jul. 12, 2010 in connection with related U.S. Appl. No. 12/380,938) (6 pages).
Abandonment dated Mar. 3, 2011 in connection with related U.S. Appl. No. 12/380,938)) in lieu of Continuation application filed Jan. 12, 2011 (3 pages).
E-mail/Letter from Applicant dated Aug. 16, 2012 in response to e-mail from Foreign Counsel dated May 16, 2012 in connection with Canadian Patent Application No. 2,647,734 (1 page).
E-mail/Letter Foreign Counsel dated Aug. 29, 2012 regarding Voluntary Submission dated Aug. 23, 2012 in connection with Canadian Patent Application No. 2,647,734 (3 pages).
E-mail/Letter from Foreign Counsel dated Feb. 27, 2014 regarding CIPO Office Action dated Aug. 26, 2013 in connection with Canadian Patent Application No. 2,647,734 (12 pages).

(56) References Cited

OTHER PUBLICATIONS

E-mail/Letter from Applicant dated Dec. 1, 2015 regarding CIPO Office Action and FC E-mail dated Jun. 9, 2014 in connection with Canadian Patent Application No. 2,647,734 (15 pages).
E-mail/Letter from Foreign Counsel dated Dec. 3, 2015 regarding CIPO Office Action and E-mail/Letter from Applicant dated Dec. 1, 2015 in connection with Canadian Patent Application No. 2,647,734 (14 pages).
E-mail/Letter from Foreign Counsel dated Aug. 22, 2016 regarding CIPO Notice of Allowance dated Aug. 16, 2016 in connection with Canadian Patent Application No. 2,647,734 (3 pages).
CIPO for Canadian Application 2,647,734 filed Oct. 3, 2008 (4 pages).
E-mail/Letter correspondence between Applicant and Foreign Counsel dated Dec. 8, 2016 through Feb. 16, 2017 regarding amendments and CIPO Notice of Allowance dated Aug. 16, 2016 in connection with Canadian Patent Application No. 2,647,734 (14 pages).

* cited by examiner

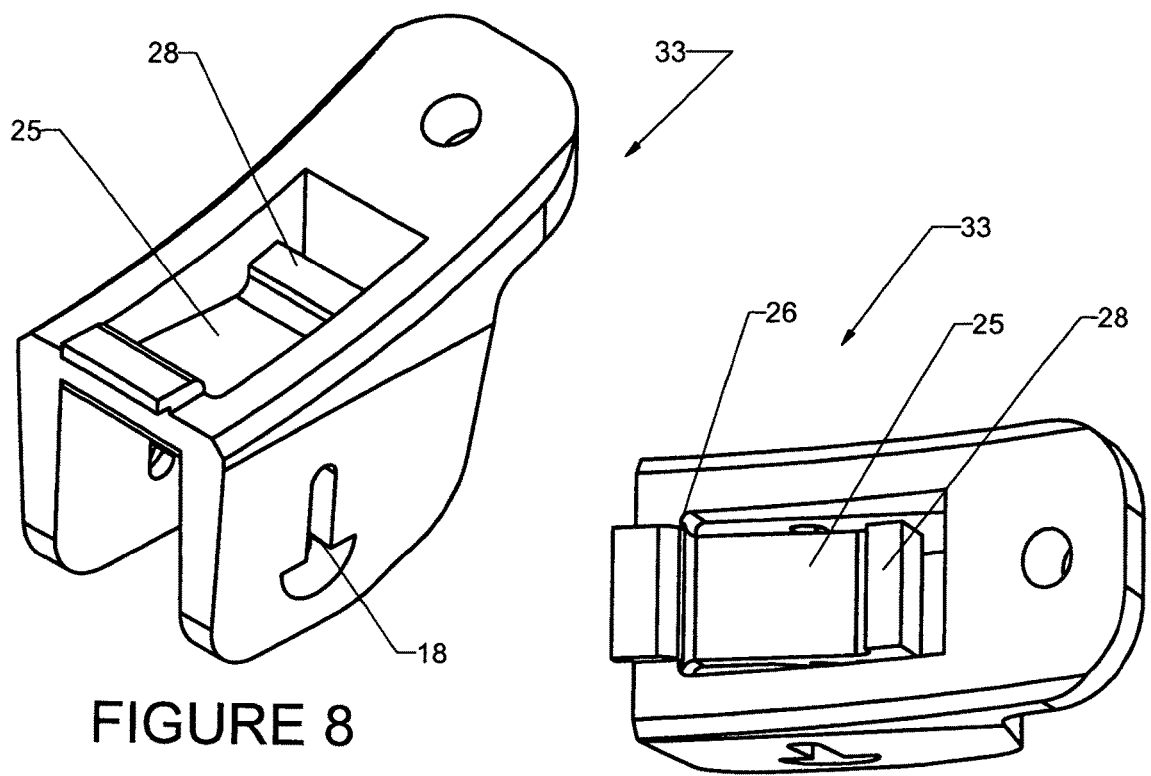
FIGURE 8
FIGURE 9
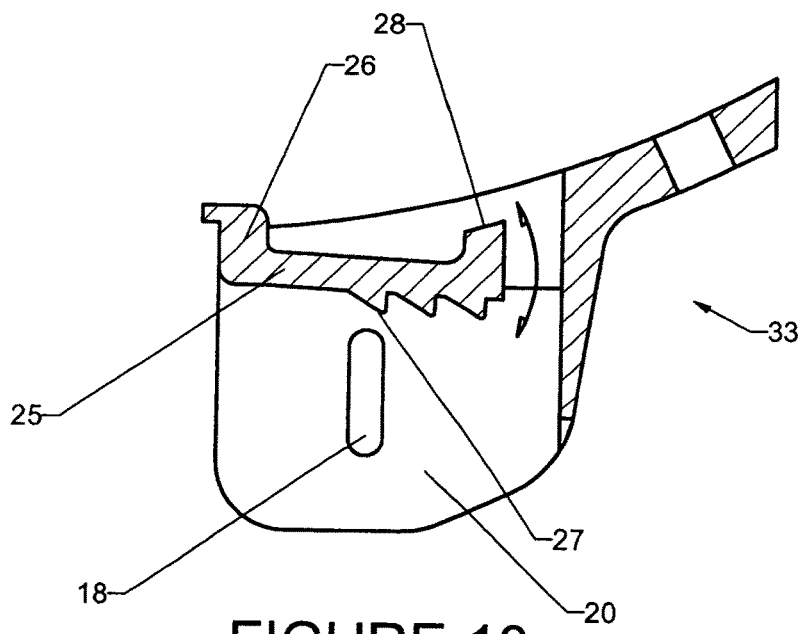
FIGURE 10

SECURING APPARATUS AND METHOD

CROSS-REFERENCE TO RELATED APPLICATIONS

This application claims the benefit of U.S. Provisional Patent Application Ser. No. 60/789,092, filed Apr. 4, 2006. This application is the national stage of International Application No. PCT/US2007/008611, filed 4 Apr. 2007.

The instant application claims priority to each of the above-referenced applications. All written material, figures, content and other disclosure in each of the above-referenced applications and the following applications are hereby incorporated by reference: application Ser. No. 11/732,937, filed Apr. 4, 2007; International Application No. PCT/US2007/008611, filed 4 Apr. 2007.

BACKGROUND OF THE INVENTION

The present invention relates generally to a locking apparatus, and more specifically, it relates to a locking apparatus for securing at least one structure or a portion of a utility service enclosure such as, for example, a watthour meter socket ring to prevent the separation of two generally opposing members of the watthour meter socket box ring.

Electrical service providers generally deliver electricity to their customers via power lines buried underground or distributed along poles or towers overhead. The provider's power lines are usually distributed from a power generation station to numerous sets of customer lines, so that customers can then use the power to satisfy their various electrical needs. To measure delivered power so that customers can be billed in proportion to their usage, service providers typically terminate their power lines at a customer's home or business facility through a metered socket box, various designs for which are well known.

A meter box is generally used by electric utility companies, however the invention herein may be used with other utility service enclosures in the gas, water, cable, TV utility industries or in other industries as well.

An example of one previously known meter box consists of two sets of electrical posts, with a provider's transmission lines being connected to one set of posts, and the customer's service lines to the other set. In order to measure the amount of electricity a customer uses, the meter box is configured to accept a watt-hour meter or another electricity usage measurement device, which, when plugged into the socket box, permits transmission of electricity from the provider to the customer and allows the amount of transmitted electricity to be accurately measured, so that the provider can charge the customer for power usage at an appropriate rate.

Various designs and uses for watthour meters are also well known, and all such designs and uses are incorporated by reference into the teachings of the present invention. The present invention is also applicable in situations where the customer's service lines are routed from the meter box to a breaker box so that electricity can be distributed to multiple service locations using additional sets of electrical lines or wires.

Presently, there are various types of meter socket boxes, each distinguished by the manner in which the meter is secured in place once it has been plugged into an electrical socket disposed in the meter box. For example, a ringed-type meter box fitted with a flanged front cover is known, within which a watthour meter is disposed so that a head portion of the meter passes out through a flanged opening in the front cover. In this configuration, the meter is generally held in place using an annular, lockable sealing ring.

In order to hold the meter in place and prevent its removal from the meter box, both the meter and meter base incorporate a corresponding set of flanges that are retained together with an annular, lockable sealing ring. The lockable sealing ring is designed to encase and captivate the corresponding flanges of the meter and base simultaneously. There are various sealing rings on the market that depend upon the security level that is desired. A lower security ring that is currently on the market utilizes an annular band, and two housing members that are installed on each end of the ring. One of these housings, a screw receiving housing, contains a receiving threaded portion. The other housing contains a rotatable screw member. The ring is secured onto the meter and socket flange by using a screwdriver to engage the screw in one housing into the receiving threaded portion of the other housing. Once engaged, the screw can be rotated clockwise, thus urging the housings toward each other, reducing the diameter of the ring to the desired position. Once the ring is secured to the meter and base, a destructible "padlock type" frangible seal is passed through corresponding slots located in the screw-receiving receiving housing and the screw; this prevents unwanted rotation of the rotatable screw member until the frangible portion of the "padlock-type seal" is cut and removed from the two corresponding slots in the screw-receiving housing and the screw. The screw can now be disengaged from the screw receiving housing by turning it in a counter-clockwise direction.

A variation of this design also incorporates a screw-receiving housing and a screw member; however, a thumb portion is located on the end of the screw to allow the installer of the meter ring to install the ring by rotating the screw by hand instead of using a screwdriver. Once fastened, a padlock-type frangible sealing device is passed through both the screw member and the screw-receiving housing. The frangible sealing device is then locked to prevent unlawful disengagement of the two members. This design is an improvement, although it is still a multiple step process to install and secure the ring onto the meter and socket.

In an attempt to overcome various shortcomings, there are various types of locking devices. Some of these locking devices are, for example, destructible locks that can be installed on ring-type meter socket boxes. Several examples of types of patents which disclose attempts to solve some of the above problems are set forth as follows.

U.S. Pat. No. 5,161,838 to Ely, et al., entitled "Locking Assembly," is directed to a locking assembly adapted for locking first and second members together, the assembly including a housing member and a stud member, the housing member being adapted to receive the stud member and permanently lock the stud member in the housing member, the assembly including a frangible portion, such that a part of the assembly is adapted to be broken away from a remainder of the assembly to permit removal of the assembly from the first and second members. This reference is incorporated by reference herein.

U.S. Pat. No. 6,406,074 to Mahaney, entitled "Destructible Locking Device," sets forth a locking device for interlocking two members having aligned openings extending therethrough. The device includes a hollow cap and a pin with an enlarged head at one end and a nose at the opposite end. The pin is insertable through the aligned openings of the members, with its nose received in interlocked engagement within the cap, and with the two members captured between the cap and the enlarged head of the pin. A frangible portion of the pin is severable in response to relative rotation between its nose and enlarged head to thereby destructively disassemble the locking device. This reference is incorporated by reference herein.

There remains a need for a securing apparatus and method for simply holding together or quickly securing at least one structure or a plurality of structures, to lock a utility service enclosure, such as for example, a meter box locking ring having, for example, flanged ends or unflanged ends. There is a need for a simpler device that is easy to use and that can be secured quickly so as to reduce installation time and effort required of the operator or installer.

SUMMARY OF THE INVENTION

An aspect of an example embodiment the present invention is to secure a captivating ring around the flanges of a watthour meter and watthour meter socket by using a simple, quick fastening installation process.

To attain this, one example embodiment comprises a circular band comprising two opposing flanges, a connector housing member, and a receiver housing member. The circular band is preferably comprised of a circular shaped ring with opposing generally parallel flanges. The connector housing member is generally comprised of a means for attachment to the circular band, an engaging portion, and teeth disposed on the engaging portion. The receiver housing member is generally comprised of a means for attachment to the circular band, two opposed generally parallel walls, a seal retaining aperture, and a tooth-engaging biasing member. The two housings are attached to the terminus ends of the circular band. When used in conjunction with a destructible "padlock type" frangible sealing device, which has been previously installed through the seal retaining aperture, the receiver housing is adapted to accept the engaging portion disposed on the connector housing member. When the two housings are urged together, the tooth engaging member disposed on the receiver housing will, through a ratchet-type action, interlock with the teeth disposed on the engaging portion of the connector housing, thus enabling the two housings to lock together and, consequently, secure the ends of the sealing band together.

To remove the ring from the watthour meter and socket, the destructible "padlock type" frangible sealing device, in one example embodiment, is cut and removed from the receiver housing, allowing the connector housing to disengage from the receiver housing, and the ring to be removed from the meter.

There has thus been outlined, rather broadly, the various example embodiments and features of the invention in order that the detailed description thereof may be better understood, and in order that the present contribution to the art may be better appreciated. There are additional features and variations of the invention that will be described hereinafter.

In this respect, before going into a detailed description, it is to be understood that the invention is not limited in its application to the details of construction and to the arrangements the components set forth in the following description or illustrated in the drawings. The invention is capable of other embodiments and of being practiced and carved out in various ways. Also, it is to be understood that the phraseology and terminology employed herein are for the purpose of the description and should not be regarded as limiting.

A further example embodiment retains the ends of a watthour sealing band together.

Another example embodiment provides a watthour meter sealing ring assembly that can be easily installed onto the flanges of a watthour meter and socket.

Another example embodiment provides a watthour meter sealing ring assembly that can be quickly installed onto the flanges of a watthour meter and socket.

Another example embodiment provides a meter sealing ring assembly that can be installed onto a watthour meter and socket without the need for special tools or keys.

Another example embodiment provides a meter sealing ring assembly that has a destructible "padlock type" frangible sealing device previously installed.

Another example embodiment provides a meter sealing ring assembly that can be removed from the watthour meter with a simple tool.

Another example embodiment provides a meter sealing ring assembly comprising one or more locking teeth to lock or "snap" two housings together.

Another example embodiment provides a meter sealing ring assembly comprising a compressible member to lock two housings together.

Another example embodiment provides a meter sealing ring assembly comprising one or more locking teeth to lock or "snap" the ends of the sealing ring together.

Another example embodiment provides a meter sealing ring assembly comprising a housing that utilizes a biasing tooth-engaging member.

Another example embodiment provides a meter sealing ring assembly including a housing that utilizes protrusions, or teeth that engage directly onto the frangible portion of a destructible sealing device.

Other aspects and advantages of embodiments will become obvious to the reader and it is intended that these aspects and advantages are within the scope of the of embodiments.

The content and disclosure of the following application is specifically hereby incorporated by reference: U.S. Provisional Patent Application No. 60/789,092, filed Apr. 4, 2006.

These and other, features, and advantages of embodiments will become apparent from the drawings, the descriptions given herein, and the appended claims. However, it will be understood that the above-listed objectives and/or advantages of the invention are intended only as an aid in quickly understanding aspects of the invention, are not intended to limit the invention in any way, and therefore do not form a comprehensive or restrictive list of objectives, and/or features, and/or advantages. Accordingly, an example embodiments provides a locking apparatus for securing at least one structure or a portion of utility service enclosure such as, for example, a watthour meter socket ring to prevent the separation of two opposing members of the watthour meter socket box ring, so as to address the needs as described above.

Another example embodiment, which will be described subsequently in greater detail, is to secure at least one structure or a plurality of structures, to lock a utility service enclosure, such as for example, a meter box locking ring having flanged or unflanged ends.

In other embodiments of the invention, a retaining member or ring may be included as an element for securing, for example, a utility service enclosure and a meter.

Another example embodiment provides a method for creating a seal, the method including at least: uniting a connector housing member including at least a force-bearing surface to a receiver housing member including at least an engaging member; disposing a frangible member on the receiver housing member for urging contact of the connector housing member with the engaging member, wherein the frangible member bears against the force-bearing surface of the connector housing member urging contact of the connector housing member with the engaging member during the uniting; and flexibly biasing the engaging member to engage the connector housing member to create a seal, wherein the engaging member is disposed separably with respect to the frangible member.

In another example embodiment of the method, the frangible member further includes at least a frangible sealing device.

In another example embodiment of the method, the connector housing member is mounted to a first end of a meter sealing ring, and the receiver housing member is mounted to a second end of the sealing ring for securing a meter to a meter box.

In another example embodiment of the method, the apparatus further includes at least the step of creating a tamper-evident seal.

In another example embodiment of the method, the apparatus further includes at least the step of mounting the connector housing member and receiver housing member on a retaining member.

In another example embodiment of the method, the engaging member is integrally formed with the receiver housing member.

In another example embodiment of the method, the receiver housing member includes at least the engaging member.

In another example embodiment of the method, the engaging member is integrally formed with the connector housing member.

In another example embodiment of the method, the engaging member is formed from a plastic, metal, foam, or rubber material.

In another example embodiment of the method, at least some portion of the connector housing member, receiver housing member, and frangible member is formed from a plastic material.

In another example embodiment of the method, the method further includes at least the step of cutting the frangible member to unseal the tamper-evident seal.

In another example embodiment of the method, the method further includes at least the step of removing frangible member from the receiver housing member to discontinue urging contact of the connector housing member with the engaging member.

In another example embodiment of the method, the engaging member includes at least a locking end and the connector housing member includes at least at least one tooth, and wherein the locking end is biased to engage the at least one tooth.

In another example embodiment of the method, the engaging member is disposed separately from the frangible member. In another example embodiment of the method, the connector housing member and receiver housing member comprise outer surfaces configured to enable a user to connect the connector housing member and receiver housing member using one hand.

In another example embodiment of the method, the frangible member includes at least a destructible padlock-type wire sealing device.

In another example embodiment of the method, at least some portion of the sealing ring is formed from a plastic material.

In another example embodiment of the method, the frangible member includes at least a non-destructible sealing device.

In another example embodiment of the method, at least some portion of the engaging member is formed from a metal material.

Another example embodiment provides an apparatus for connecting and disconnecting first and second ends of a watthour meter box ring adapted for use in securing a watthour meter to a watthour meter box, the apparatus including at least: a connector housing member including at least a force-bearing surface, the connector housing member being mountable on the first end of the watthour meter box ring; a receiver housing member being mountable on the second end of the watthour meter box ring; an engaging member disposable between the receiver housing member and connector housing member, wherein the engaging member is flexibly biased to engage the connector housing member; and a frangible member disposed on the receiver housing member, wherein the frangible member is adapted to bear against the force-bearing surface of the connector housing member so as to urge contact of the connector housing member with the engaging member when the connector housing member is connected with the receiver housing member.

In another example embodiment of the apparatus, the frangible member further includes at least a frangible sealing device.

In another example embodiment of the apparatus, the frangible sealing device includes at least a tamper-evident seal.

In another example embodiment of the apparatus, the receiver housing member includes at least the engaging member.

In another example embodiment of the apparatus, the engaging member is integrally formed with the receiver housing member.

In another example embodiment of the apparatus, the engaging member is integrally formed with the connector housing member.

In another example embodiment of the apparatus, the engaging member is disposed separately from the frangible member.

In another example embodiment of the apparatus, the connector housing is mounted to the first end of the watthour meter box ring, and the receiver housing member is mounted to the second end of the sealing ring for securing the watthour meter box ring.

In another example embodiment of the apparatus, at least some portion of the apparatus is formed from a plastic material.

In another example embodiment of the apparatus, the engaging member is removeably captured between the receiver housing member and the retaining member.

In another example embodiment of the apparatus, the engaging member includes at least a locking end and the connector housing member includes at least at least one tooth, and wherein the locking end is biased to engage the at least one tooth.

In another example embodiment of the apparatus, the connector housing member and receiver housing member comprise outer surfaces configured to enable a user to connect the connector housing member and receiver housing member using one hand.

In another example embodiment of the apparatus, the frangible member includes at least a destructible padlock-type wire sealing device.

In another example embodiment of the apparatus, the frangible member includes at least a non-destructible sealing device.

In another example embodiment of the apparatus, the engaging member is formed from a plastic, metal, foam, or rubber material.

In another example embodiment of the apparatus, at least some portion of the connector housing member, receiver housing member, and frangible member is formed from a plastic material.

In another example embodiment of the apparatus, wherein at least some portion of the engaging member is formed from a metal material.

In another example embodiment of the apparatus, the frangible member is removeable from the receiver housing member so as to not urge contact of the connector housing member with the engaging member.

In another example embodiment of the apparatus, the connector housing member and receiver housing member comprise outer surfaces configured to enable a user to connect the connector housing member and receiver housing member using one hand.

In another example embodiment of the apparatus, wherein at least some portion of the watthour meter box ring is formed from a plastic material.

There has thus been outlined, rather broadly, the various example embodiments and features of the invention in order that the detailed description thereof may be better understood, and in order that the present contribution to the art may be better appreciated. There are additional features and variations of the invention that will be described hereinafter.

In this respect, before going into a detailed description, it is to be understood that the invention is not limited in its application to the details of construction and to the arrangements the components set forth in the following description or illustrated in the drawings. The invention is capable of other embodiments and of being practiced and carved out in various ways. Also, it is to be understood that the phraseology and terminology employed herein are for the purpose of the description and should not be regarded as limiting.

To the accomplishment of the above, this invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein:

FIGS. 8 and 9 are perspective views of an example embodiment the present invention showing an alternate embodiment of the receiver housing member.

FIG. 10 is a front cutaway view of an example embodiment the present invention showing the receiver housing member shown in FIGS. 8 and 9. This drawing illustrated the movement of the flexural locking member.

Figure 1:
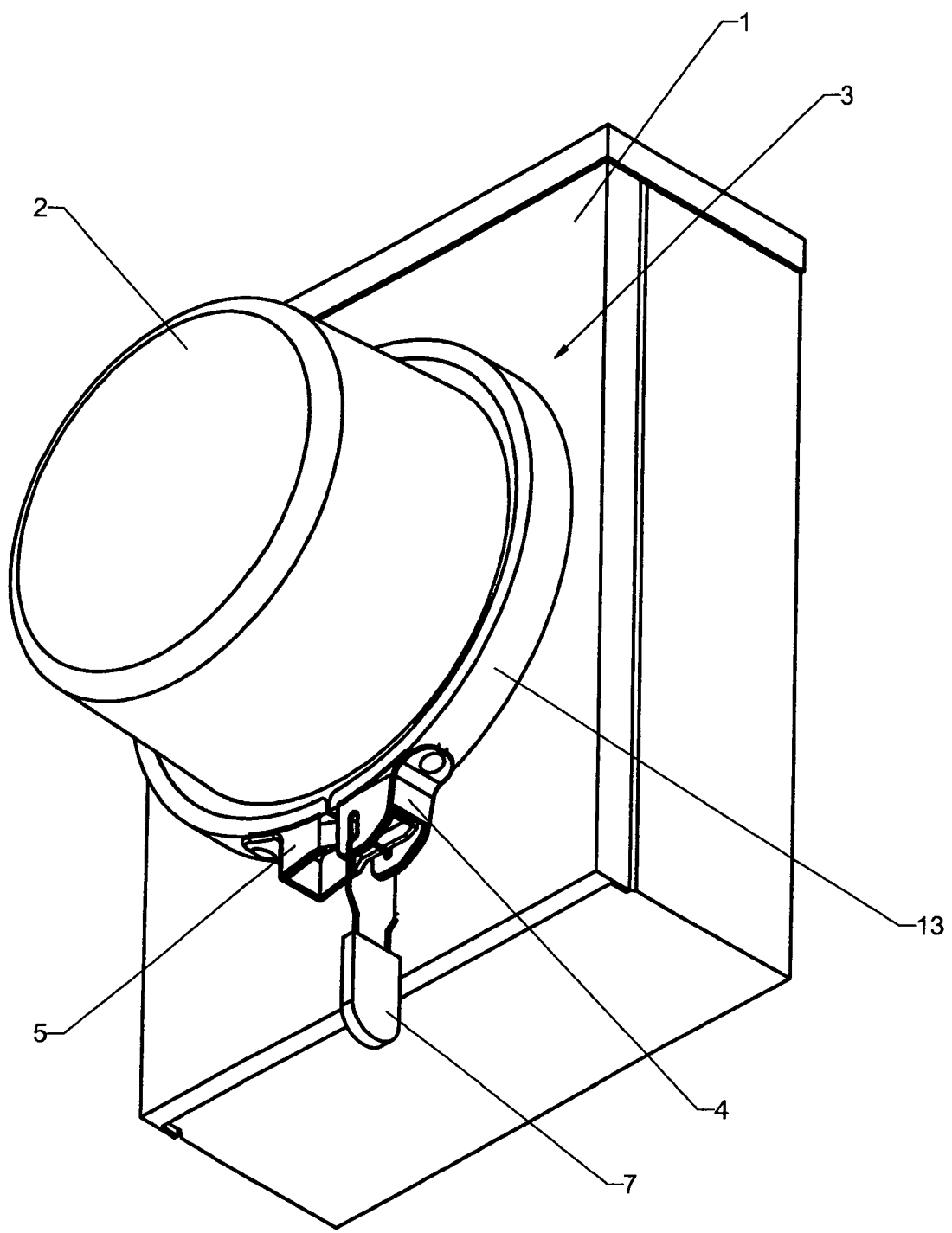
FIG. 1 is a perspective view of an example embodiment the present invention showing the watthour meter securing ring installed into a watthour meter and socket.

While the present invention will be described in connection with example embodiments, it will be understood that it is not intended to limit the invention to those embodi-

DETAILED DESCRIPTION OF THE INVENTION

Turning now descriptively to the drawings, in which similar reference characters denote similar elements throughout the several views, the attached figures illustrate an apparatus for securing a plurality of structures or a portion of a utility service enclosure. For example, in one embodiment, the apparatus is used for securing a watthour meter socket ring so as to prevent the separation of two opposing members of the watthour meter socket box ring. The apparatus may be used for creating a tamper-evident seal by securably connecting a plurality of structures. The apparatus may also be used as a locking assembly with at least one structure as will hereinafter be explained in further detail.

Referring now to FIG. 1, there is shown, in one example embodiment, a quick fastening ring assembly 3 comprising a retaining band 13, a receiver housing member 4, a connector housing member 5, and a sealing device, such as a destructible "padlock-type" sealing device 7, shown in the following embodiments, installed onto a watthour meter 2 and watthour meter socket box 1.

The sealing device 7 as shown in the following embodiments, comprises a frangible portion 8 (or urging member) and a housing adapted to accept the frangible portion 8. This sealing device is not limited to the construction or the configuration that is shown in the following embodiments; for example, materials other than those defined by a "frangible" may be used, such as plastic, or other material. The sealing device may also comprise a single ring, strap, a clip, etc., that performs a similar function.

Figure 2:
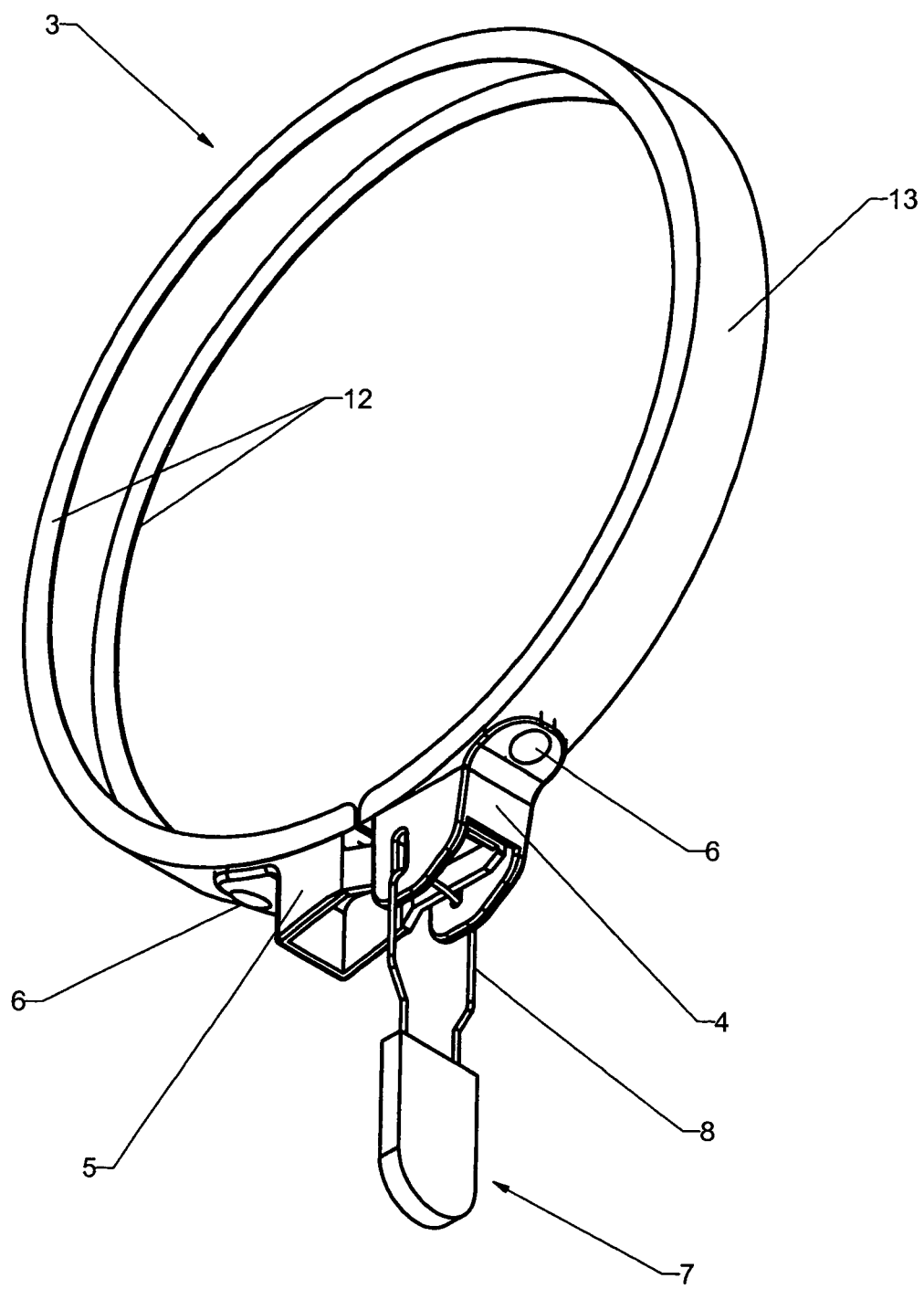
FIG. 2 is a perspective view of an example embodiment the present invention showing the watthour meter securing ring.
Figure 3:
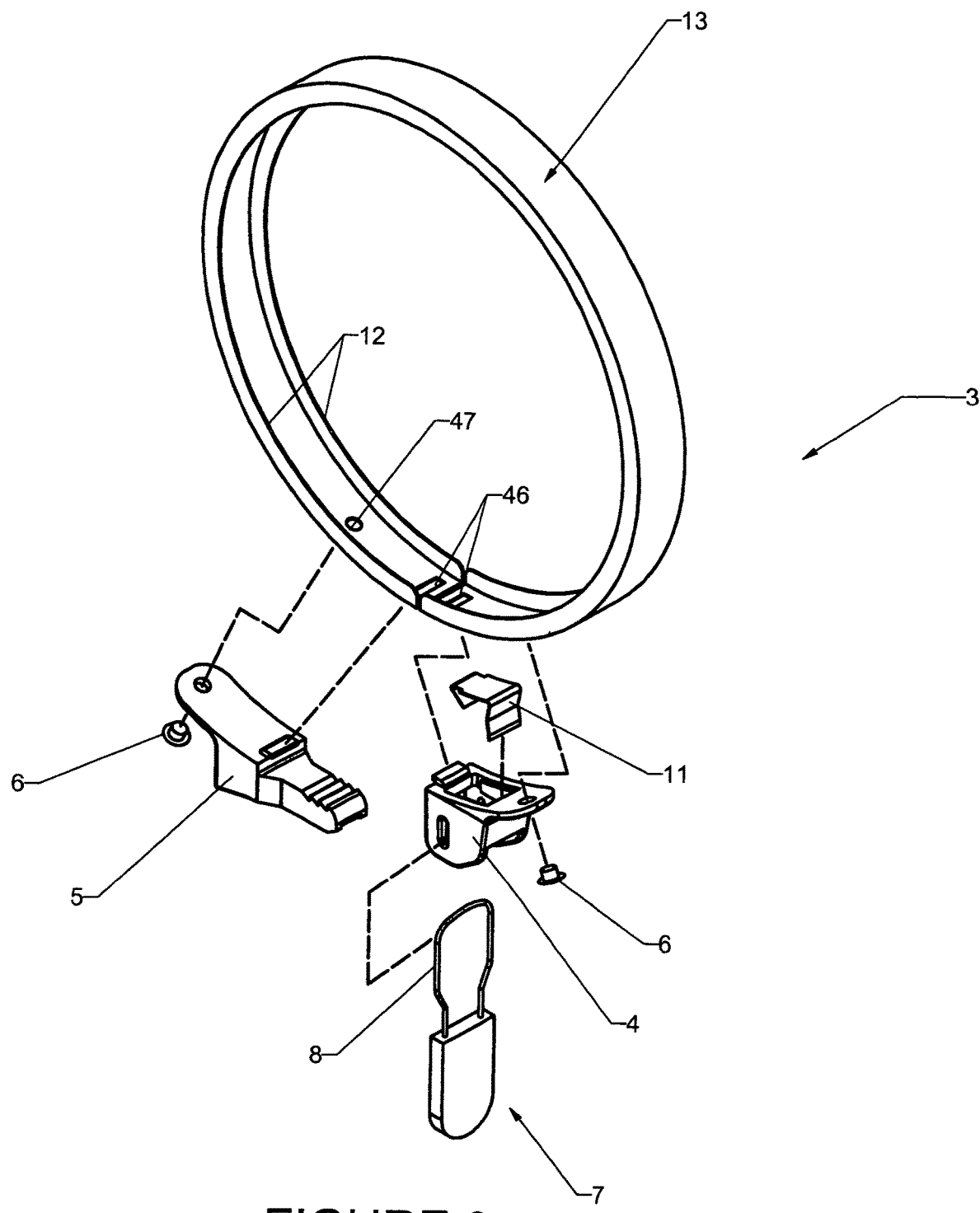
FIG. 3 is a perspective exploded view of an example embodiment the present invention showing the watthour meter securing ring assembly.
Figure 4:
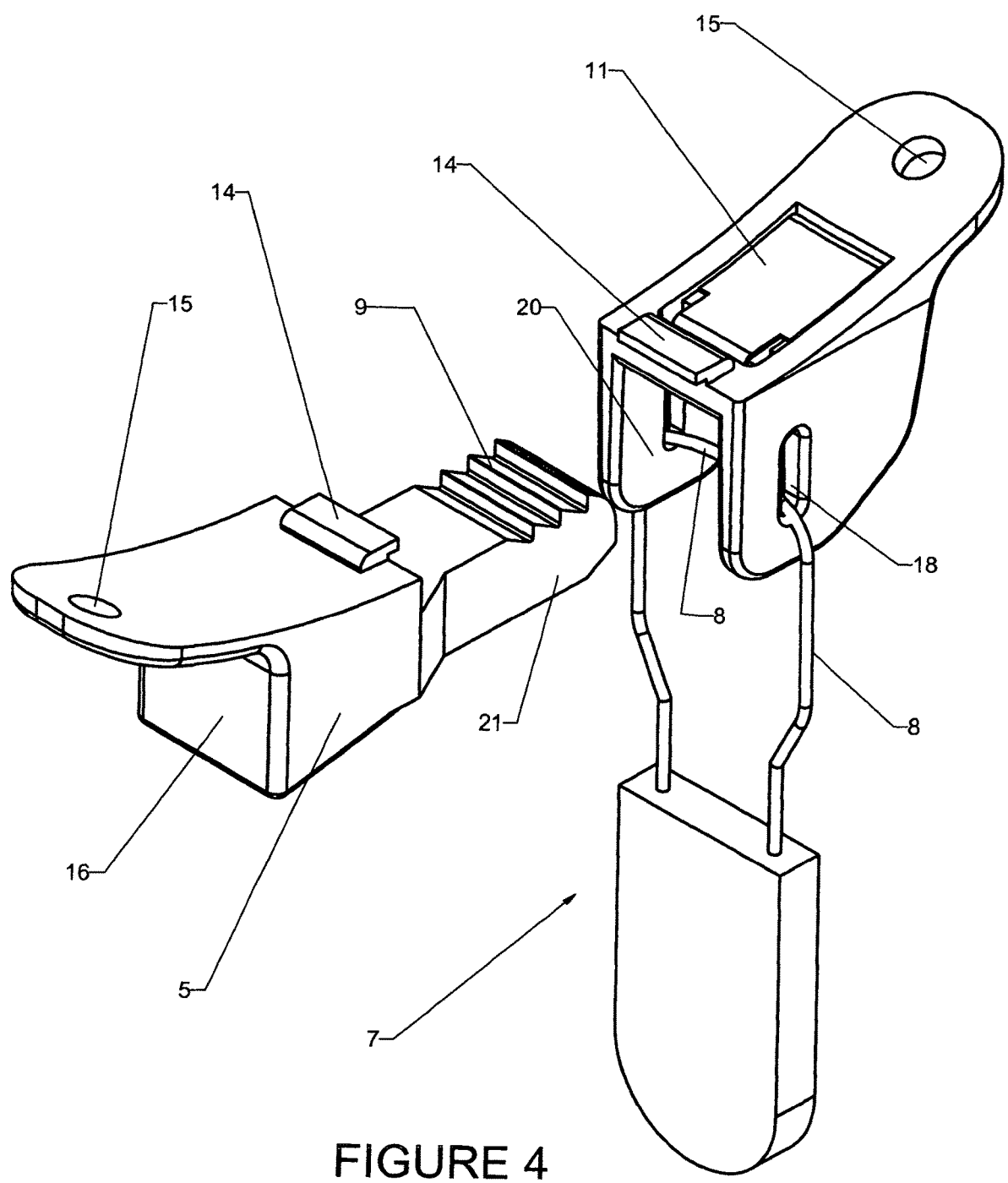
FIGS. 4 and 5 are perspective views of an example embodiment the present invention showing the connector housing member, receiver housing member, and a destructible "padlock type" frangible sealing device.

Referring to FIG. 2, the retaining band 13, formed into a generally circular configuration, comprises two generally parallel captivating flanges 12, and one or more retaining apertures 46,47.

The connector housing member 5 and receiver housing member 6 is attached to the terminus ends of the retaining band 13 using a rivet 6 or similar device.

In this embodiment, as shown in FIGS. 3-7, the receiver housing 6 comprises an engaging member 11, two generally parallel side flanges 20, a seal retaining aperture 18, a housing retaining aperture 15, a retaining flange 14 and an installation bearing surface 17.

The engaging member 11 generally comprises a flexible biasing member, a securing portion 23, and a locking end 22. The configuration of the engaging member 11 is not limited to this embodiment; any shape, or material that performs a securing function, as defined in the following embodiment, such as foam, rubber, plastic, metal, etc. may be used. Any configuration that enables the engaging member 11 to be held in place that performs a similar function as described herein can be also be used. The locking end 22 may be comprised of no multiple engagement surfaces, one engagement surface, or multiple engagement surfaces or contact points arranged in any geometrical configuration.

The connector housing member 5 comprises a housing retaining aperture 15, a housing retaining flange 14, an installation bearing surface 16, and an engaging portion 21.

The engaging portion 21 of the connector housing member is not limited to the configuration that is shown and described in the following embodiments. Variations of the shape, locking means, or materials may be utilized. For example, the material may be rubber, plastic, or compressible foam to perform a similar function as described. The engaging portion may utilize no protrusions, one protrusion, or multiple protrusions or "teeth" as shown in the following embodiments.

The securing portion 23 of the engaging member 11 is inserted and compressed into the space defined by the inside wall portion 48 and the two opposing protrusions 24 of the receiver housing member 4. The engaging member 11 may be rigidly, or loosely held in place by other means such as welding, gluing, encasing, etc. The receiver housing member 4 is installed to the securing ring 13 by engaging the retaining flange 14 of the receiver housing member 4 into the retaining aperture 46 disposed in the securing ring 13. Other means for retaining the receiver housing 4 to the ring 13 may be used such as welding, gluing, pressing, swaging, etc. A rivet or other attaching device 6 is inserted and fastened though aperture 15 and 47 of the receiver housing member 4 and the securing ring 13, respectively. Once the receiver housing member 4 is installed onto the ring 13, engaging member 11 is completely captivated by the upper surface of the opposing protrusions 24 and the lower surface of the securing ring 13. The connector housing member 5 is installed into the ring in a similar fashion as described above for the receiver housing 4.

Figure 6:
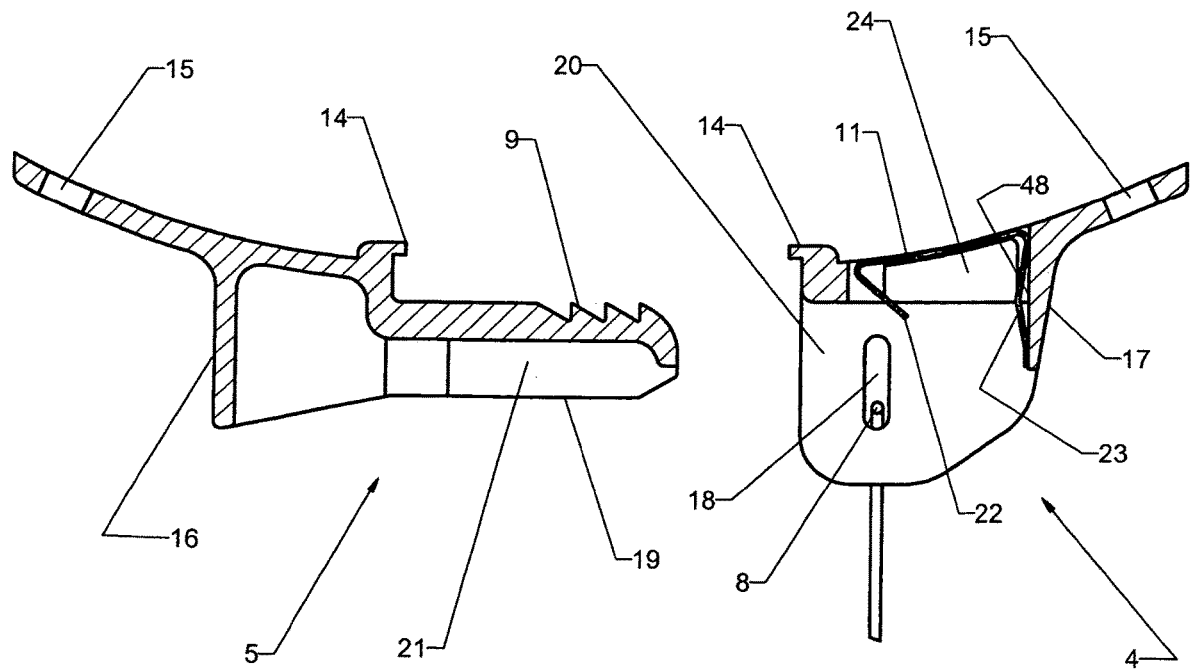
FIG. 6 is a front cutaway view of an example embodiment the present invention showing the connector housing member, receiver housing member, and a destructible "padlock type" frangible sealing device. The connector housing member is disengaged from the receiver housing member.

In the unlocked position, the connector housing member 5 is separated from the receiver housing member 4. The frangible portion 8 (or urging member) of the destructible "padlock-type" sealing device 7 is pre-installed through the seal retaining aperture 18 disposed in the two side flanges on the receiver housing member 4 as shown in FIG. 6.

Figure 7:
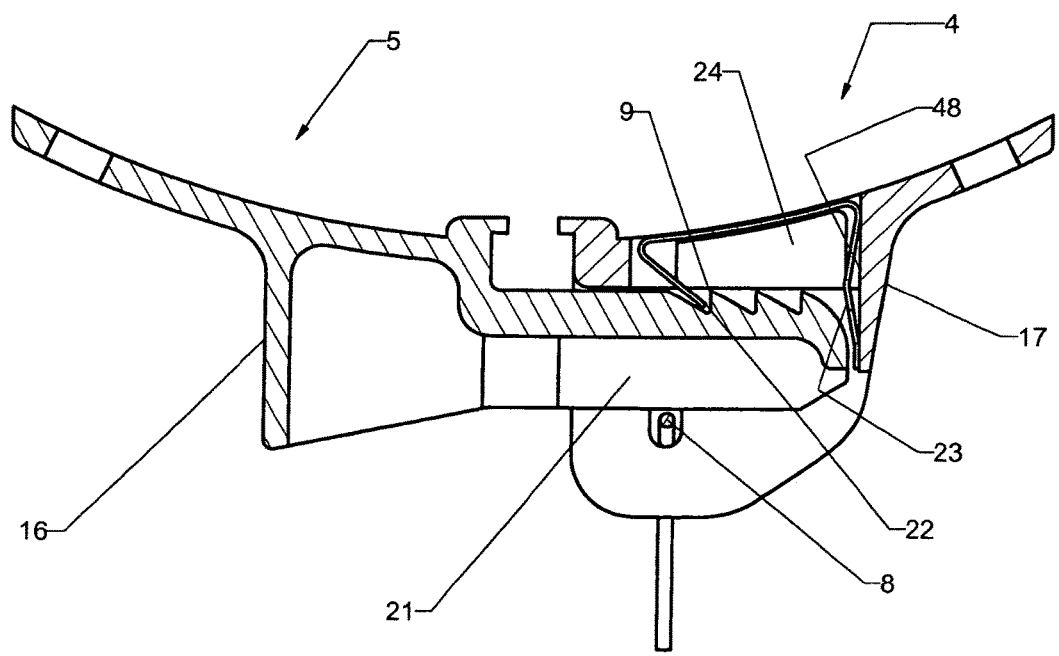
FIG. 7 is a front cutaway view of an example embodiment the present invention showing the connector housing member, receiver housing member, and a destructible "padlock type" frangible sealing device. The connector housing member is engaged into the receiver housing member.
Figure 11:
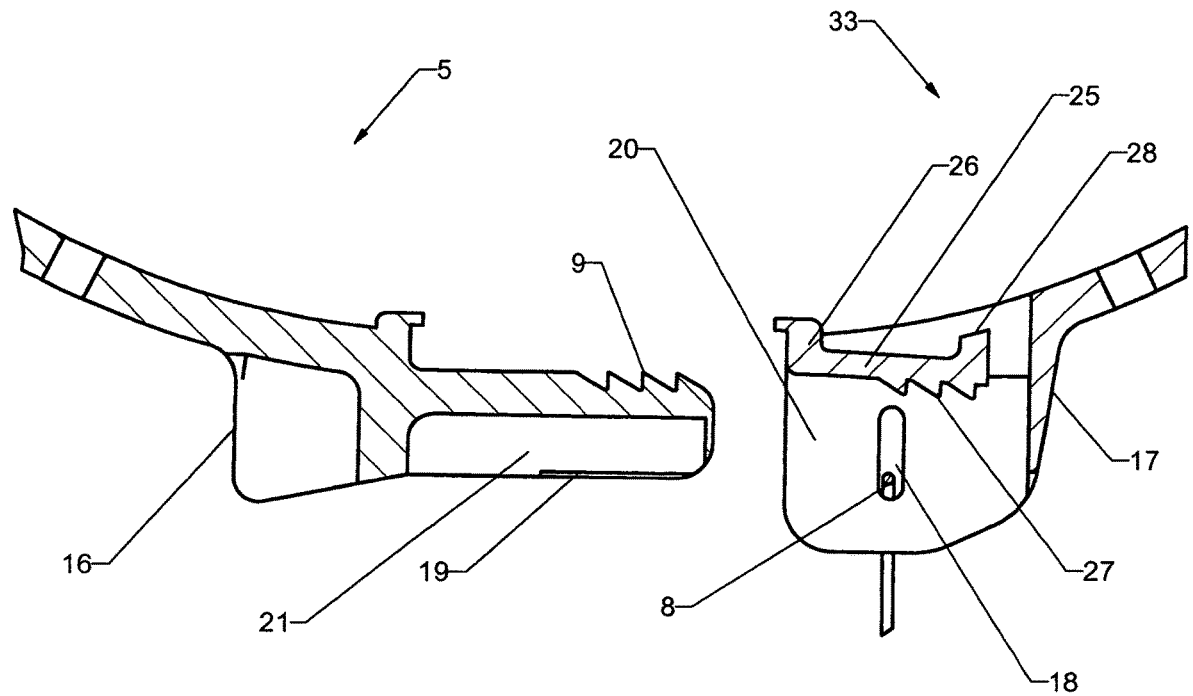
FIG. 11 is a front cutaway view of an example embodiment the present invention showing the connector housing member, the receiver housing member shown in FIG. 10, and a destructible "padlock type" frangible sealing device. The connector housing member is disengaged from the receiver housing member.

As force is applied to the installation bearing surfaces 16 and 17 of the connector 5 and receiver 4 housings, respectively, the engaging portion 21 of the connector housing member 5 moves into the space defined by the side flanges 20 of the receiver housing member 4. The lower bearing surface 19 of the engaging portion 21 bears on the frangible portion 8 (or urging member) of the sealing device 7. Due to the limited vertical space defined by the and the receiver housing engaging member 11, the teeth 9 of the connector housing engaging portion 21 displace and flex the receiver housing engaging member 11 at the locking end 22. This tooth 9 and engaging end 22 interaction resembles a ratchet-type action as the engaging member 11 will continue to flex until the locking end 22 locks into the next tooth 9 of the connector housing engaging member 21. In the event that multiple teeth, or locking positions are utilized as shown in the current embodiment, the operator may continue to urge the housings 5,4 together until the desired installation position of the housings 5, 4 is reached as shown in FIG. 7.

Once the housings 4,5 are in the locked position, the engaging member 11 is encased by the engaging portion 21 of the connector housing 5, the side flanges 20 of the receiver housing 4 and the bearing surface 17 of the receiver housing 4. An attempt to defeat or unlock the ring assembly 3 at this time without destroying or fracturing one or more of the components is extremely difficult.

Figure 5:
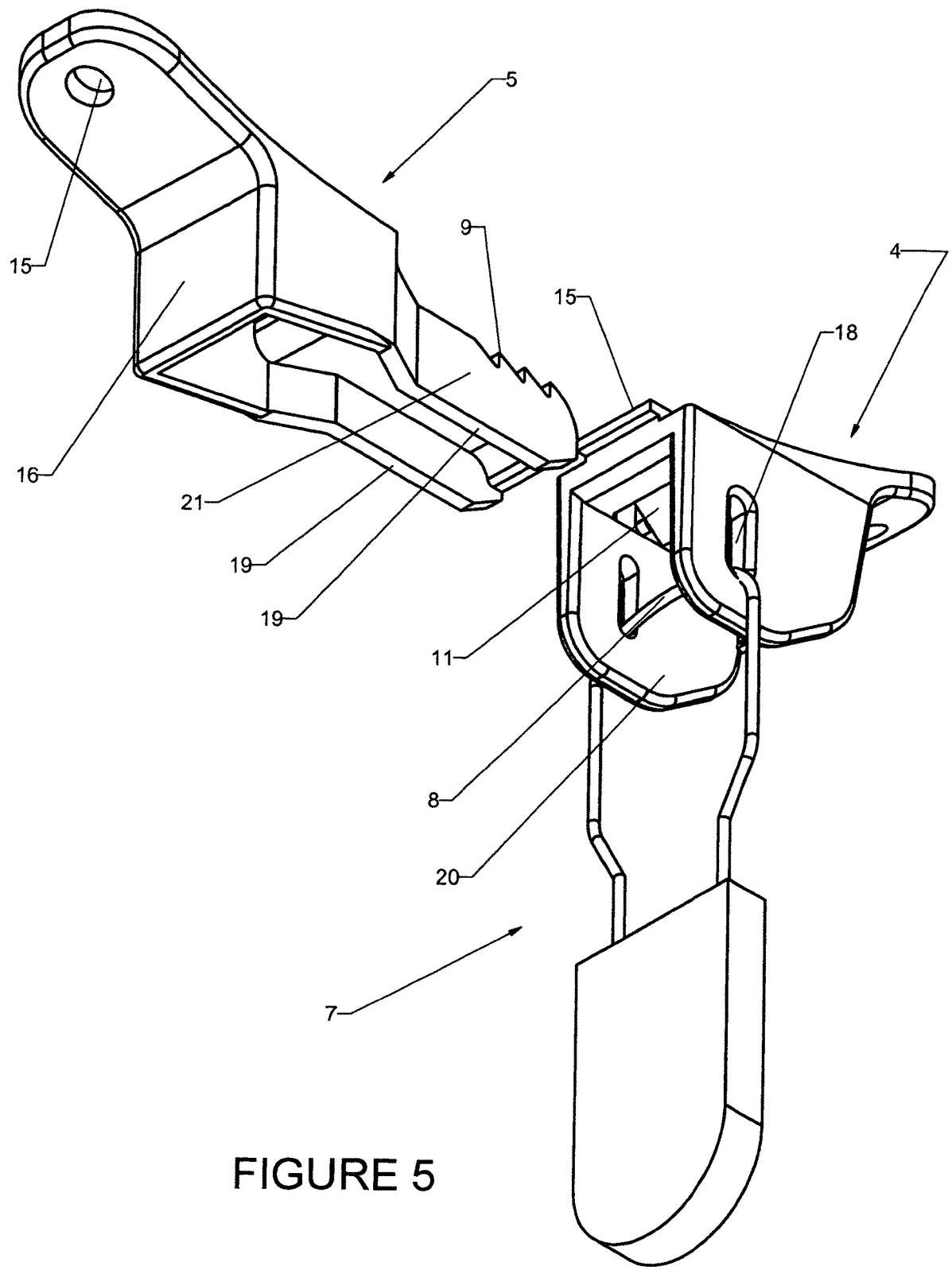

In order to unlock the ring assembly 3 and disengage the connector housing member 5 from the receiver housing member 4, the frangible portion 8 (or urging member) of the sealing device 7 is cut between bearing surfaces 19 of the engaging portion 21 disposed on connector housing member 5, shown in FIG. 5. This can be performed, in some example embodiments, with a standard hand held wire cutter. (Note that other embodiments may only require the urging member be removed and not destroyed, or cut.) Once cut, the cut ends of the frangible portion 8 can be pulled in opposing directions and removed from the receiver housing 4. Without support from the frangible portion 8, the installer can disengage the locking end 22 disposed on the engaging member 11 from the teeth 9 disposed on the connector housing engaging portion 21, and the housings 4, 5 can be separated.

An alternate embodiment of the receiver housing member is shown in FIGS. 8-12. In this embodiment, the receiver housing 33 comprises two generally parallel side flanges 20, a seal retaining aperture 18, a housing retaining aperture 15, a retaining flange 14 an installation bearing surface 17, and a flexural engaging member 25.

The flexural engaging member 25 generally comprises a flexible biasing member. The configuration of the engaging member 25 is not limited to this embodiment; any shape, or material that performs a securing function, as defined in the following embodiment, such as foam, rubber, plastic, metal, etc. may be used. The locking end 22 may be comprised of either no engagement surfaces, one engagement surface, or multiple engagement surfaces (as shown in the following embodiment) or contact points arranged in any geometrical configuration.

In the following embodiment, the flexural engaging member 25 comprises a base portion 26, one of more locking teeth 27. The engaging member 25 is attached to the receiver housing member 33 only at the base portion 26. This allows the engaging member 25 to flex and return to the original position if the receiver housing 33 is constructed from the correct material, typically plastic. A stop portion 28 may be disposed on the engaging member 25 to insure that over-rotation is not possible.

The connector housing 5 and the receiver housing 33 functions in a similar manner as described in the previous embodiment.

Figure 12:
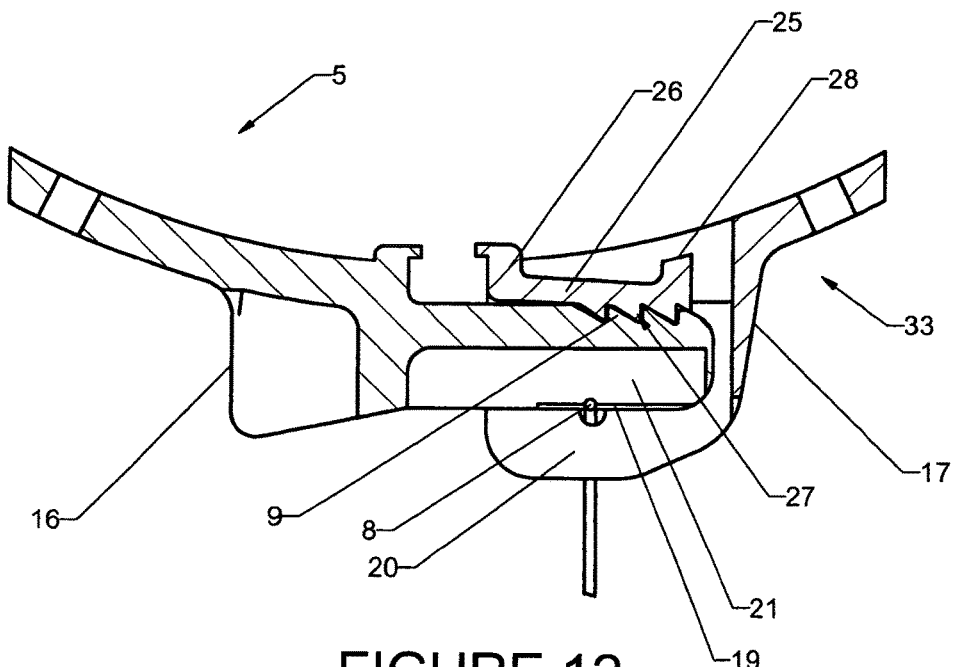
FIG. 12 is a front cutaway view of an example embodiment the present invention showing the connector housing member, the receiver housing member shown in FIG. 11, and a destructible "padlock type" frangible sealing device. The connector housing member is engaged into the receiver housing member.

As force is applied to the installation bearing surfaces 16 and 17 of the connector 5 and receiver 33 housings, respectively, the engaging portion 21 of the connector housing member 5 moves into the space defined by the side flanges 20 of the receiver housing member 33. The lower bearing surface 19 of the engaging portion 21 bears on the frangible portion 8 of the sealing device 7. Due to the limited vertical space defined by the frangible portion 8 and the upper portion of the receiver housing 33, the teeth 9 of the connector housing engaging portion 21 displace and flex the receiver housing engaging member 25. This tooth 9 and engaging member 25 interaction resembles a ratchet-type action as the flexural engaging member 25 will continue to flex until the locking teeth 27 lock into the next tooth 9 of the connector housing engaging member 21. In the event that multiple teeth, or locking positions are utilized as shown in the current embodiment, the operator may continue to urge the housings 5,33 together until the desired installation position of the housings 5, 33 is reached as shown in FIG. 12.

Once the housings 5, 33 are in the locked position, the flexural engaging member 25 is encased by the engaging portion 21 of the connector housing 5, the side flanges 20 of the receiver housing 33 and the bearing surface 17 of the receiver housing 33. An attempt to defeat or unlock the ring assembly at this time without destroying or fracturing one or more of the components is extremely difficult.

In order to unlock the ring assembly 3 and disengage the connector housing member 5 from the receiver housing member 33, the frangible portion 8 of the sealing device 7 is cut between bearing surfaces 19 of the engaging portion 21 disposed on connector housing member 5. This can be performed with a standard hand held wire cutter. Once cut, the cut ends of the frangible portion 8 (or urging member) can be pulled in opposing directions and removed from the receiver housing 33. Without support from the frangible portion 8, the installer can disengage the teeth 27 of the flexural engaging member 25 from the teeth 9 disposed on the connector housing engaging portion 21, and the housings 33, 5 can be separated.

Figure 13:
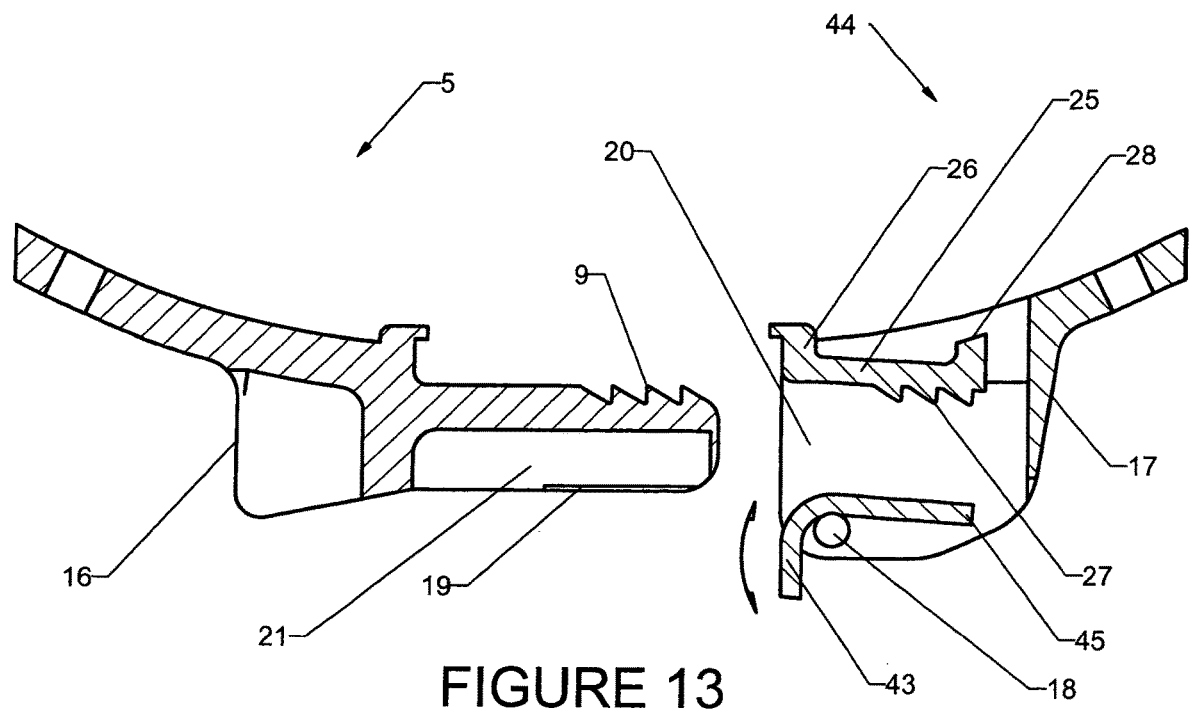
FIG. 13 is a front cutaway view of an example embodiment the present invention showing the connector housing member, an alternate embodiment of the receiver housing member, and a destructible "padlock type" frangible sealing device. The connector housing member is disengaged from the receiver housing member.
Figure 14:
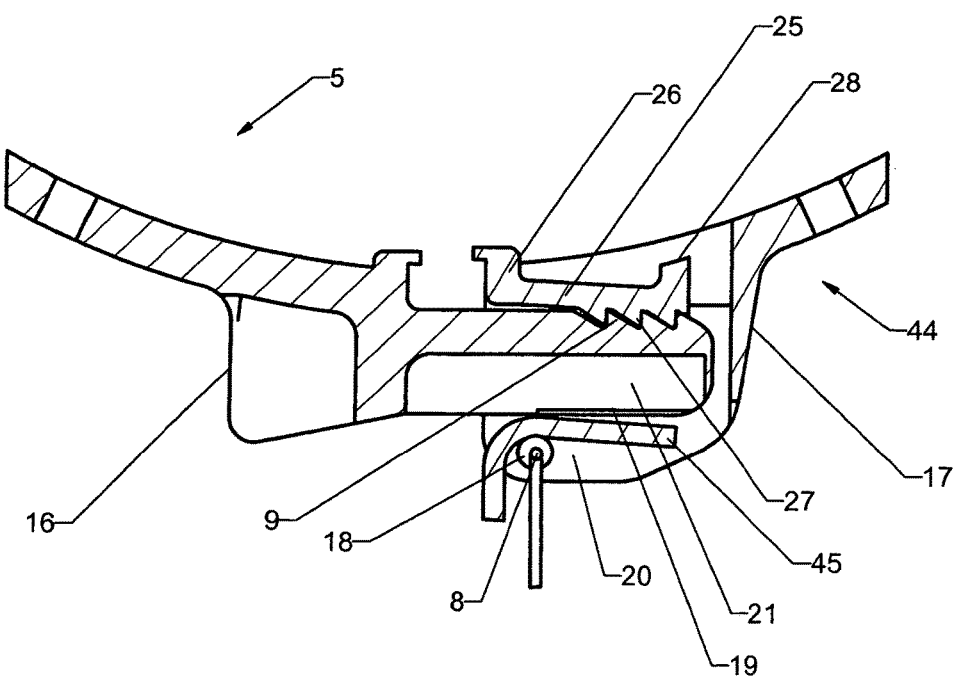
FIG. 14 is a front cutaway view of an example embodiment the present invention showing the connector housing member, the receiver housing member shown in FIG. 13, and a destructible "padlock type" frangible sealing device. The connector housing member is engaged into the receiver housing member.

Another alternate embodiment of the receiver housing member is shown in FIGS. 13 and 14. In this embodiment, the receiver housing 44 comprises two generally parallel side flanges 20, a seal retaining aperture 18, a housing retaining aperture 15, a retaining flange 14 an installation bearing surface 17, a flexural engaging member 25, and a flexural compression member.

The flexural engaging member 25 generally comprises a flexible biasing member. The configuration of the engaging member 25 is not limited to this embodiment; any shape, or material that performs a securing function, as defined in the following embodiment, such as foam, rubber, plastic, metal, etc. may be used. The locking end 22 may be comprised of either no engagement surfaces, one engagement surface, or multiple engagement surfaces (as shown in the following embodiment) or contact points arranged in any geometrical configuration.

In the following embodiment, the flexural engaging member 25 comprises a base portion 26, one of more locking teeth 27. The engaging member 25 is attached to the receiver housing member 33 only at the base portion 26. This allows the engaging member 25 to flex and return to the original position if the receiver housing 44 is constructed from the correct material, typically plastic. A stop portion 28 may be disposed on the engaging member 25 to insure that over-rotation is not possible.

The flexural compression member 43 is attached to the side walls 20 of the receiver housing 44 only at base portion 45. This allows the member 43 to flex as shown in FIG. 13. The configuration of the flexural compression member 43 is not limited to this embodiment. Any shape, material, and location with respect to the receiver housing 44 may be used.

As force is applied to the installation bearing surfaces 16 and 17 of the connector 5 and receiver 44 housing, respectively, the engaging portion 21 of the connector housing member 5 moves into the space defined by the side flanges 20 of the receiver housing member 44. The lower bearing surface 19 of the engaging portion 21 bears on the flexural compression member 43 of the receiver housing member 44. Due to the limited vertical space defined by the flexural compression member 43 and the flexural engaging member 25 of the receiver housing 33, the teeth 9 of the connector housing engaging portion 21 displace and flex the receiver housing engaging member 25. This tooth 9 and engaging member 25 interaction resembles a ratchet-type action as the flexural engaging member 25 will continue to flex until the locking teeth 27 lock into the next 9 of the connector housing engaging member 21. In other potential embodiments not shown, the flexural compression member 25 will flex, while engaging member 25 remains rigid. In the event that multiple teeth, or locking positions are utilized as shown in the current embodiment, the operator may continue to urge the housings 5,33 together until the desired installation position of the housings 5, 33 is reached as shown in FIG. 14. Once this desired position is reached, the frangible portion 8 (or urging member) of a padlock type frangible seal device previously described can be inserted into the seal retaining aperture 18 disposed on the receiver housing 44. This prevents the flexural compression member 43 from moving in a downward direction and releasing the connector housing 5 from the receiver housing 44.

Once the housings 5, 44 are in the locked position, the flexural engaging member 25 is encased by the engaging portion 21 of the connector housing 5, the side flanges 20 of the receiver housing 44 and the bearing surface 17 of the receiver housing 33. An attempt to defeat or unlock the ring assembly at this time without destroying or fracturing one or more of the components is extremely difficult.

In order to unlock the ring assembly 3 and disengage the connector housing member 5 from the receiver housing member 33, the frangible portion 8, in one example embodiment, of the sealing device 7 is cut. This can be performed with a standard hand held wire cutter. Once cut, the cut ends of the frangible portion 8 can be pulled in opposing directions and removed from the receiver housing 44. Without support from the frangible portion 8, the installer can flex the compression member 43 in a downward direction. The teeth 27 of the flexural engaging member 25 can now disengage from the teeth 9 disposed on the connector housing engaging portion 21, and the housings 44, 5 can be separated.

Figure 15:
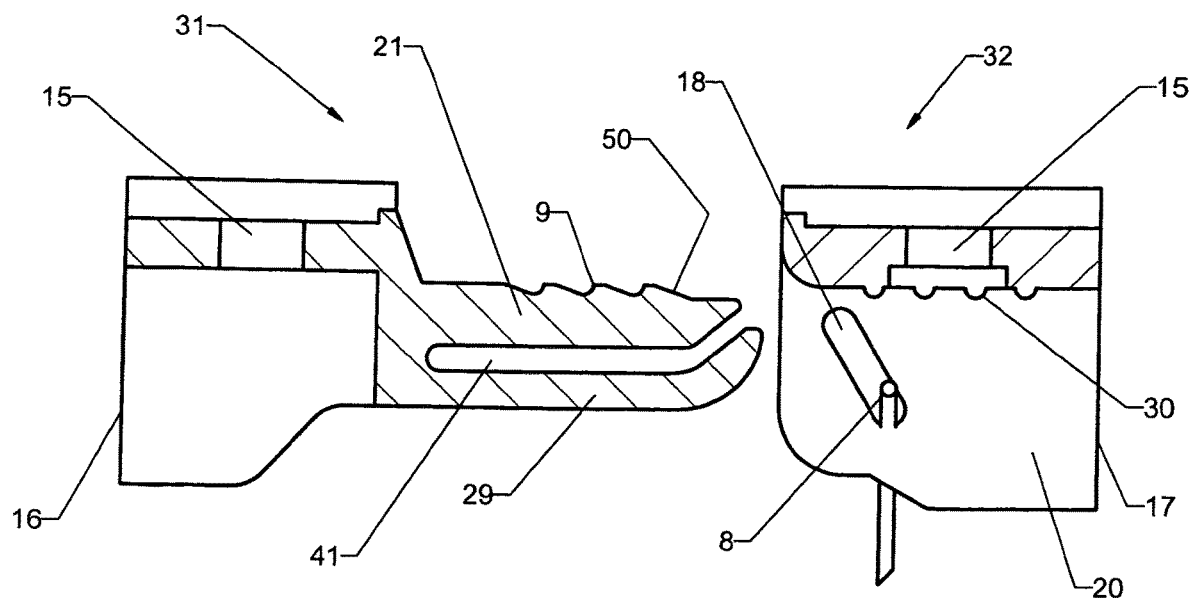
FIG. 15 is a front cutaway view of an example embodiment the present invention showing an alternate embodiment of the connector housing member, an alternate embodiment of the receiver housing member, and a destructible "padlock type" frangible sealing device. The connector housing member is disengaged from the receiver housing member.
Figure 16:
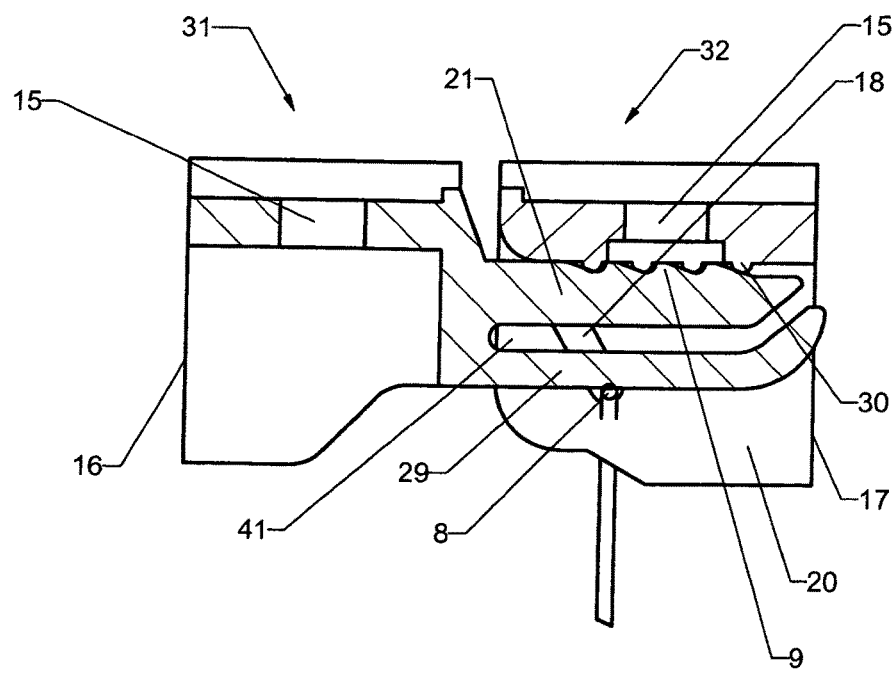
FIG. 16 is a front cutaway view of an example embodiment the present invention showing the connector housing member and receiver housing member shown in FIG. 15, and a destructible "padlock type" frangible sealing device. The connector housing member is engaged into the receiver housing member.

Another example embodiment of the connector and receiver housing member is shown in FIGS. 15 and 16. In this embodiment, the receiver housing 32 comprises two generally parallel side flanges 20, a seal retaining aperture 18, a housing retaining aperture 15, a retaining flange 14, an installation bearing surface 17, and one or more tooth engaging members 30.

The connector housing member 31 comprises a housing retaining aperture 15, a housing retaining flange 14, an installation bearing surface 16, an engaging portion 21 on which one or more protrusions or "teeth" 9 are disposed, and a flexural compression member 29.

In the unlocked position, the connector housing member 31 is separated from the receiver housing member 32. The frangible portion 8, in one embodiment, of the destructible "padlock-type" sealing device 7 is pre-installed through the seal retaining aperture 18 disposed in the two side flanges 20 on the receiver housing member 32 as shown in FIG. 15.

As force is applied to the installation bearing surfaces 16 and 17 of the connector 31 and receiver 32 housing, respectively, the engaging portion 21 of the connector housing member 31 moves into the space defined by the side flanges 20 of the receiver housing member 32. The flexural compression member 29 bears on the frangible portion 8 (or urging member) of the padlock-type sealing device 7 and due to the limited vertical space defined by the frangible portion 8 (or urging member) and the tooth engaging members 30, the tooth engaging members 30 move along and compress against the tooth surface 50 disposed on the teeth 9. This tooth 9 and engaging member 30 interaction resembles a ratchet-type action as flexural compression member 29 will continue to flex until engaging member 21 lock into the next tooth 9 of the connector housing engaging member 21. In other potential embodiments not shown, the upper portion of connector engaging member 21 will flex as the flexural compression member 29 remains rigid. In the event that multiple teeth, or locking positions are utilized as shown in the current embodiment, the operator may continue to urge the housings 31,32 together until the desired installation position of the housings 31,32 is reached as shown in FIG. 16.

In order to unlock the ring assembly 3 and disengage the connector housing member 31 from the receiver housing member 32, the frangible portion 8 of the sealing device 7 is cut. This can be performed with a standard hand held wire cutter. Once cut, the cut ends of the frangible portion 8 can be pulled in opposing directions and removed from the receiver housing 32. Without support from the frangible portion 8, the flexural compression member 29 will not bear on any surface. The teeth 9 of the connector housing engaging member 21 can now disengage from the tooth engaging members 30 disposed on the receiver housing member 32, and the housings 31,32 can be separated.

Figure 17:
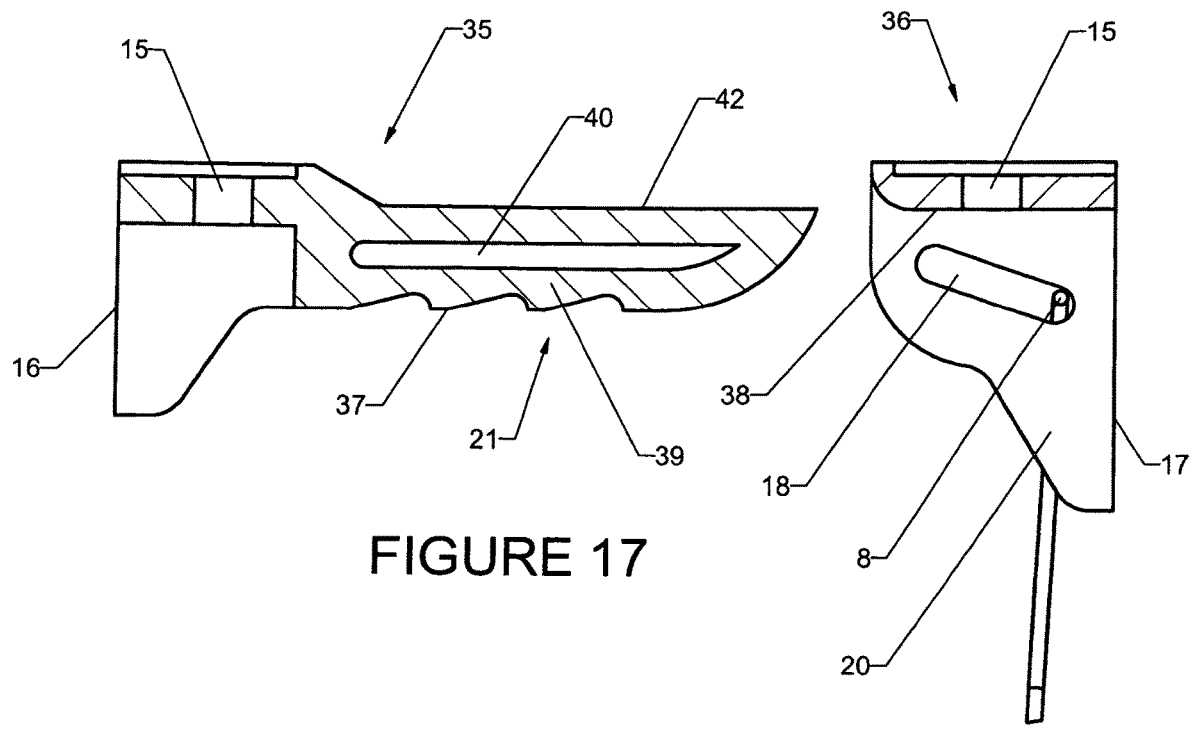
FIG. 17 is a front cutaway view of an example embodiment the present invention showing an alternate embodiment of the connector housing member, an alternate embodiment of the receiver housing member, and a destructible "padlock type" frangible sealing device. The connector housing member is disengaged from the receiver housing member.
Figure 18:
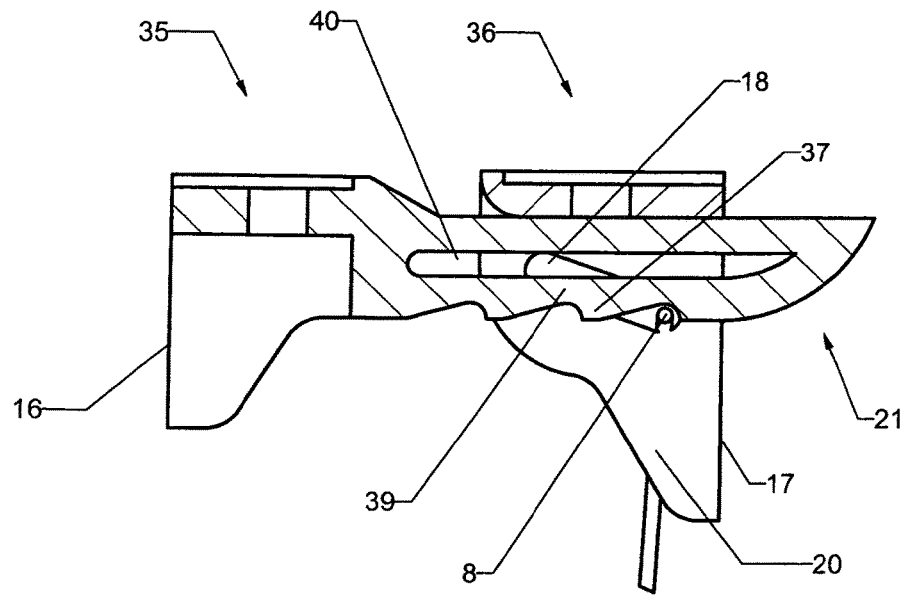
FIG. 18 is a front cutaway view of an example embodiment the present invention showing the connector housing member and the receiver housing member shown in FIG. 17, and a destructible "padlock type" frangible sealing device. The connector housing member is engaged into the receiver housing member.

Another alternate embodiment of the connector and receiver housing member is shown in FIGS. 17 and 18. In this embodiment, the receiver housing 36 comprises two generally parallel side flanges 20, a seal retaining aperture 18, a housing retaining aperture 15, a retaining flange 14, an installation bearing surface 17, and a connector engaging member bearing surface 38.

The connector housing member 35 comprises, a housing retaining aperture 15, a housing retaining flange 14, an installation bearing surface 16, and an engaging portion 21 on which protrusions or "teeth" 37 are disposed.

In the unlocked position, the connector housing member 35 is separated from the receiver housing member 36. The frangible portion 8 (or urging member) of the destructible "padlock-type" sealing device 7 is pre-installed through the seal retaining aperture 18 disposed in the two side flanges 20 on the receiver housing member 36 as shown in FIG. 17.

As force is applied to the installation bearing surfaces 16 and 17 of the connector 35 and receiver 36 housing, respectively, the engaging portion 21 of the connector housing member 35 moves into the space defined by the side flanges 20 of the receiver housing member 36. Because the vertical space defined by frangible portion 8 (or urging member) of sealing device 7 and bearing surface 38 disposed on receiver housing member 36 is limiting, the lower portion of connector housing engaging member 21 bears on frangible portion 8 (or urging member) of padlock-type sealing device 7, and, concurrently, the upper bearing surface 42 of connector housing 35 bears against surface 38 disposed on receiver housing member 36. As the housings 35,36 are urged closer together, the frangible portion 8 bears with increasing compressive force against the flexural portion 39 of the connector engaging member 21 causing the flexural portion 39 to deflect into the void 40 until the tooth 37 disposed on the connector engaging portion 21 passes over frangible portion 8. If the connector housing member 35 is constructed with the proper material, such as a type of plastic, the flexural portion 39 will return back toward its original position and trap the frangible portion 8 into the tooth 37. In other embodiments not shown, either the upper portion of the connector engaging member 21, or the flexural portion 39 of the connector housing 35, will flex and the resulting action will resemble a ratcheting-type action. In the event that multiple teeth, or locking positions are utilized as shown in the current embodiment, the installer may continue to urge the housings 35,36 closer together until the desired installation position of the housings 31,32 is reached as shown in FIG. 18.

In order to unlock the ring assembly 3 and disengage the connector housing member 35 from the receiver housing member 36, the frangible portion 8 of the sealing device 7 is cut. This can be performed with a standard hand held wire cutter. Once cut, the cut ends of the frangible portion 8 can be pulled in opposing directions and removed from the receiver housing 32. The teeth 37 of the connector housing engaging member 21 can now disengage from the frangible portion 8 of the padlock-type sealing device 7 and the housings 35, 36 can be separated.

In another example embodiment a quick-fastening watthour meter securing device is provided and includes a circular band comprising two opposing flanges, a connector housing member, and a receiver housing member. The two housings are attached to the terminus ends of the circular band. The connector housing member incorporates protrusions that resemble teeth or ribs. When used in conjunction with a tamper-evident locking device, the protrusions disposed on the connector housing are able to engage, resembling a ratchet-type action, with the receiver housing member, constraining the circular band to a desired diameter. When installed onto a watthour meter and socket that is designed to accept a standard meter locking ring, the quick-engaging meter ring retains the meter to the socket. When it is desired to remove the watthour meter ring from its socket, simply cutting the tamper-evident locking device will allow the connector housing member to disengage from the receiver housing member, allowing the user to remove the circular band from the meter and socket.

Various other example embodiments provide an securing apparatus that may be adapted for use on a utility service enclosure. A connector and receiver housing could be configured with mounting structure for various types of rings, flanged with apertures or unflanged. Such an embodiment could be use to quickly secure various structures. Additionally, a utility service enclosure is used not only in the electric utility industry (e.g., a meter box) but also in the gas, water, cable, TV utility industries or in other utility industries.

In another embodiment an apparatus is provided for creating a seal. A securing apparatus is adapted to unite a plurality of structures. As noted, in one embodiment, the ring may not be included and the ends of, for example a meter ring having opposing apertures may be secured. However, the securing apparatus could also be configured to be used to secure a plurality of plates having apertures, engageable protrusions, or other engageable structural configurations such that the plates could be held together with a securing apparatus of various configurations.

Turning again to another example embodiment, FIG. 1 illustrates a quick fastening ring assembly 3 or a fastening device. Various structures which could be interchangeable with other embodiments could also be referred to as, for example, a retaining member 13 (rather than a retaining band 13), a receiver housing 4 (rather than a receiver housing member 4), an engaging member 11 preferably being biased, a connector 5 or fastening member (rather than a connector housing member 5), a securing member 7 (rather than a destructible "padlock-type" sealing device 7), an urging member 8 (rather than a frangible portion 8) with these the fastening device adapted to be installed onto a watthour meter 2 and watthour meter socket box 1. The receiver housing in one embodiment comprises an engaging member. A biasing member, in one embodiment is adapted for biasing the engaging member to engage the connector to the receiver housing when being urged by the urging member 8.

In another example embodiment a tamper-evident seal could be used with the urging member to indicate if there has been tampering with the meter box or meter.

In use, one example embodiment of a method is provided for indicating tampering with a meter box 1. The method includes at least uniting a connector 5 to a receiver housing 4 which preferably comprises an engaging member 11 preferably including biasing structure. The method further includes urging contact of the connector 5 with the receiver housing 4 or engaging member 11, in one example embodiment, by providing an urging member 8 selectively positioned so as to urge or cause the connector to selectively make contact with the engaging member receiver housing 4 when the connector 5 is being inserted into the receiver housing 4; biasing the engaging member to engage the connector.

The method may also include, in some example embodiments, creating a tamper-evident seal.

The method also includes, in one other example embodiment, mounting the connector 5 and receiver housing 4 on a retaining member 13.

The design described does not limit the scope of the invention; the number of members, flanges or other structures may change, or various components may be added or removed to the above-described concept to aid in improved security and operation.

The foregoing disclosure and description of the invention is illustrative and explanatory of presently preferred embodiments of the invention and variations thereof, and it will be appreciated by those skilled in the art, that various changes in the design, organization, order of operation, means of operation, equipment structures and location, methodology, the use of mechanical equivalents, such as different types of fasteners and locking devices than as illustrated whereby different steps may be utilized, as well as in the details of the illustrated construction or combinations of features of the various elements may be made without departing from the spirit of the invention. As well, the drawings are intended to describe the concepts of the invention so that the presently preferred embodiments of the invention will be plainly disclosed to one of skill in the art but are not intended to be manufacturing level drawings or renditions of final products and may include simplified conceptual views as desired for easier and quicker understanding or explanation of the invention. As well, the relative size and arrangement of the components may be varied from that shown and the invention still operate well within the spirit of the invention as described hereinbefore and in the appended claims. Thus, various changes and alternatives may be used that are contained within the spirit of the invention.

Accordingly, as can be seen, the foregoing disclosure and description of the invention is illustrative and explanatory thereof, and it will be appreciated by those skilled in the art, that various changes in the ordering of steps, ranges, interferences, spacings, hardware, and/or attributes and parameters, as well as in the details of the illustrations or combinations of features of the methods and system discussed herein, may be made without departing from the spirit of the invention.

What is claimed is:

1. A method for creating a seal, the method comprising:
    uniting a connector housing member comprising a force-bearing surface to a receiver housing member comprising an engaging member;
    disposing a frangible member on the receiver housing member for urging contact of the connector housing member with the engaging member, wherein the frangible member bears against the force-bearing surface of the connector housing member urging contact of the connector housing member with the engaging member during the uniting; and
    flexibly biasing the engaging member to engage the connector housing member to create a seal, wherein the engaging member is disposed separably with respect to the frangible member.

2. The method of claim 1, wherein the frangible member further comprises a frangible sealing device.

3. The method of claim 1, wherein the connector housing member is mounted to a first end of a meter sealing ring, and the receiver housing member is mounted to a second end of the sealing ring for securing a meter to a meter box.

4. The method of claim 1, further comprising the step of creating a tamper-evident seal.

5. The method of claim 1, further comprising the step of mounting the connector housing member and receiver housing member on a retaining member.

6. The method of claim 1, wherein the engaging member is integrally formed with the receiver housing member.

7. The method of claim 1, wherein the receiver housing member comprises the engaging member.

8. The method of claim 1, wherein the engaging member is integrally formed with the connector housing member.

9. An apparatus for connecting and disconnecting first and second ends of a watthour meter box ring adapted for use in securing a watthour meter to a watthour meter box, the apparatus comprising:
- a connector housing member comprising a force-bearing surface, the connector housing member being mountable on the first end of the watthour meter box ring;
- a receiver housing member being mountable on the second end of the watthour meter box ring;
- an engaging member disposable between the receiver housing member and connector housing member, wherein the engaging member is flexibly biased to engage the connector housing member; and
- a frangible member disposed on the receiver housing member, wherein the frangible member is adapted to bear against the force-bearing surface of the connector housing member so as to urge contact of the connector housing member with the engaging member when the connector housing member is connected with the receiver housing member.

10. The apparatus of claim 9, wherein the frangible member further comprises a frangible sealing device.

11. The apparatus of claim 10, wherein the frangible sealing device comprises a tamper-evident seal.

12. The apparatus of claim 9, wherein the receiver housing member comprises the engaging member.

13. The apparatus of claim 9, wherein the engaging member is integrally formed with the receiver housing member.

14. The apparatus of claim 9, wherein the engaging member is integrally formed with the connector housing member.

15. The apparatus of claim 9, wherein the engaging member is disposed separately from the frangible member.

16. The apparatus of claim 10, wherein the connector housing is mounted to the first end of the watthour meter box ring, and the receiver housing member is mounted to the second end of the sealing ring for securing the watthour meter box ring.

17. The method of claim 1, wherein the engaging member is formed from a plastic, metal, foam, or rubber material.

18. The method of claim 1, wherein at least some portion of the connector housing member, receiver housing member, and frangible member is formed from a plastic material.

19. The method of claim 4, further comprising the step of cutting the frangible member to unseal the tamper-evident seal.

20. The method of claim 1, further comprising the step of removing frangible member from the receiver housing member to discontinue urging contact of the connector housing member with the engaging member.

21. The method of claim 1, wherein the engaging member comprises a locking end and the connector housing member comprises at least one tooth, and wherein the locking end is biased to engage the at least one tooth.

22. The apparatus of claim 9, wherein at least some portion of the apparatus is formed from a plastic material.

23. The apparatus of claim 9, wherein the engaging member is removeably captured between the receiver housing member and the retaining member.

24. The method of claim 1, wherein the engaging member is disposed separately from the frangible member.

25. The method of claim 1, wherein the connector housing member and receiver housing member comprise outer surfaces configured to enable a user to connect the connector housing member and receiver housing member using one hand.

26. The method of claim 1, wherein the frangible member comprises a destructible padlock-type wire sealing device.

27. The method of claim 3, wherein at least some portion of the sealing ring is formed from a plastic material.

28. The method of claim 1, wherein the frangible member comprises a non-destructible sealing device.

29. The method of claim 18, wherein at least some portion of the engaging member is formed from a metal material.

30. The apparatus of claim 9, wherein the engaging member comprises a locking end and the connector housing member comprises at least one tooth, and wherein the locking end is biased to engage the at least one tooth.

31. The apparatus of claim 9, wherein the connector housing member and receiver housing member comprise outer surfaces configured to enable a user to connect the connector housing member and receiver housing member using one hand.

32. The apparatus of claim 9, wherein the frangible member comprises a destructible padlock-type wire sealing device.

33. The apparatus of claim 9, wherein the frangible member comprises a non-destructible sealing device.

34. The apparatus of claim 9, wherein the engaging member is formed from a plastic, metal, foam, or rubber material.

35. The apparatus of claim 9, wherein at least some portion of the connector housing member, receiver housing member, and frangible member is formed from a plastic material.

36. The apparatus of claim 35, wherein at least some portion of the engaging member is formed from a metal material.

37. The apparatus of claim 9, wherein the frangible member is removeable from the receiver housing member so as to not urge contact of the connector housing member with the engaging member.

38. The apparatus of claim 9, wherein the connector housing member and receiver housing member comprise outer surfaces configured to enable a user to connect the connector housing member and receiver housing member using one hand.

39. The apparatus of claim 16, wherein at least some portion of the watthour meter box ring is formed from a plastic material.

\* \* \* \* \*